United States Patent
Saripella et al.

[11] Patent Number: 5,946,255
[45] Date of Patent: Aug. 31, 1999

[54] WORDLINE SYNCHRONIZED REFERENCE VOLTAGE GENERATOR

[75] Inventors: Satish C. Saripella, Starkville; Jeffery Scott Hunt, Ackerman, both of Miss.

[73] Assignee: Cypress Semiconductor Corp., San Jose, Calif.

[21] Appl. No.: 09/126,832

[22] Filed: Jul. 31, 1998

[51] Int. Cl.$^6$ .................................................. G11C 7/02
[52] U.S. Cl. ............................................................. 365/210
[58] Field of Search ................................. 365/210, 205, 365/207, 191

[56] References Cited

U.S. PATENT DOCUMENTS

| | | | |
|---|---|---|---|
| 5,193,076 | 3/1993 | Houston | 365/233.5 |
| 5,291,447 | 3/1994 | Kodama et al. | 365/190 |
| 5,309,395 | 5/1994 | Dickinson et al. | 365/189.04 |
| 5,325,337 | 6/1994 | Buttar | 365/210 |
| 5,388,075 | 2/1995 | Vinal | 365/189.05 |
| 5,394,361 | 2/1995 | Dickinson | 365/189.04 |
| 5,473,565 | 12/1995 | Kusakari | 365/189.01 |
| 5,473,568 | 12/1995 | Okamura | 365/210 |
| 5,479,374 | 12/1995 | Kobayashi et al. | 365/233.5 |
| 5,502,681 | 3/1996 | Park | 365/210 |
| 5,544,101 | 8/1996 | Houston | 365/189.02 |
| 5,559,752 | 9/1996 | Stephens, Jr. et al. | 365/233 |
| 5,596,539 | 1/1997 | Passow et al. | 365/210 |
| 5,604,705 | 2/1997 | Ackland et al. | 365/205 |
| 5,610,862 | 3/1997 | Teel | 365/189.05 |
| 5,625,595 | 4/1997 | Ikeda | 365/194 |
| 5,644,773 | 7/1997 | DiMarco | 395/750 |
| 5,659,513 | 8/1997 | Hirose et al. | 365/205 |
| 5,661,417 | 8/1997 | Kondoh | 365/87 |
| 5,661,691 | 8/1997 | Lin | 365/208 |
| 5,703,831 | 12/1997 | Sawada | 365/233 |
| 5,717,653 | 2/1998 | Suzuki | 365/233 |
| 5,724,287 | 3/1998 | Takenaka | 365/191 |
| 5,729,503 | 3/1998 | Manning | 365/233.5 |
| 5,742,552 | 4/1998 | Greenberg | 365/210 |
| 5,745,419 | 4/1998 | Brauch | 365/201 |
| 5,748,544 | 5/1998 | Hashimoto | 365/201 |
| 5,751,170 | 5/1998 | Pyeon | 327/57 |
| 5,752,270 | 5/1998 | Wada | 711/169 |
| 5,754,481 | 5/1998 | Yabe et al. | 365/189.05 |
| 5,757,718 | 5/1998 | Suzuki | 365/233.5 |
| 5,761,136 | 6/1998 | Park et al. | 365/191 |
| 5,771,197 | 6/1998 | Kim | 365/210 |
| 5,844,851 | 12/1998 | Pascucci et al. | 365/210 |

OTHER PUBLICATIONS

Jeffrey S. Hunt et al., U.S.S.N. 09/107,000 Method, Architecture and Circuit for Writing to and Reading from a Memory During a Single Cycle, filed Jun. 29, 1998.

Jeffrey S. Hunt et al., U.S.S.N. 09/106,806 Method, Architecture and Circuit for Writing to a Memory, filed Jun. 29, 1998.

Jeffrey S. Hunt et al., U.S.S.N. 09/132,000 Method, Architecture and Circuit for Reducing and/or Eliminating Small Signal Voltage Swing Sensitivity, filed Aug. 10, 1998.

Jeffrey S. Hunt et al., U.S.S.N. 09/103,960 Self–Timed Sense Amplifier Evaluation Scheme, filed Jun. 24, 1998.

*Primary Examiner*—Son T. Dinh
*Attorney, Agent, or Firm*—Christopher P. Maioranna, P.C.

[57] ABSTRACT

The present invention concerns a circuit comprising a memory array having a plurality of wordlines and a plurality of bitlines, a reference circuit, a column select circuit, an enable control circuit, and one or more sense amplifiers. The reference circuit may be configured to present a reference voltage signal in response to (i) a dummy wordline and (ii) a virtual ground signal, where the dummy wordline may be synchronized with each of the plurality of wordlines. The column select circuit may be configured to present the virtual ground signal in response to a column select signal. The enable control circuit may be configured to present an enable signal in response to the dummy wordline. The sense amplifiers may be configured to generate an output in response to (i) the enable signal, (ii) the reference signal and (iii) the bitlines.

17 Claims, 7 Drawing Sheets

5,946,255

WORDLINE SYNCHRONIZED REFERENCE VOLTAGE GENERATOR

FIELD OF THE INVENTION

The present invention relates to memories generally and, more particularly, to a wordline synchronized reference voltage generator.

BACKGROUND OF THE INVENTION

Memories may detect a particular data value stored in a particular cell by presenting a signal, such as a signal TBUS, to a sense amplifier. The sense amplifier generally compares the voltage of the signal TBUS to a reference voltage. The reference voltage may be a global static reference voltage, a local static reference voltage or a dynamic reference voltage.

Referring to FIG. 1, a circuit 10 is shown illustrating a global reference voltage circuit that may be used in a memory. The circuit 10 generally comprises a memory array block 12, a column select block 14, a sense amplifier block 16 and a global reference block 18. The memory array block 12 includes a number of wordlines WL<0:m> that are shown presented to an input 20. The memory array block 12 presents a number of bitlines (i.e., BL<0:n>) to an input 22 of the column select block 14. A column address (i.e., COL<0:x>) is presented to an input 24 of the column select block 14. The column select block 14 presents the signal TBUS (i.e., TBUS<0:y>) to an input 26 of the sense amplifier block 16. The global reference block 18 presents a global reference signal (i.e., GREF) to an input 28 of the sense amplifier block 16. The sense amplifier block 16 presents a signal (i.e., SAOUT<0:y>) at an output 30 that represents the state of the data stored in the memory array block 12 at a particular location.

Referring to FIG. 2, a timing diagram of the various signals of FIG. 1 is shown. The signal WL<0> has a positive transition 32 which selects a wordline<0> and a negative transition 34 which deselects the wordline<0>. The signal WL<m> has a positive transition 36 which selects a wordline<m> and a negative transition 38 which deselects wordline<m>. The signal COL<0> has a positive transition 40 which selects a column<0> and a negative transition 42 which deselects the column<0>. The signal BL<0> has a negative transition 44 that responds to the positive transition 32 of the signal WL<0>. The signal TBUS <0> has a negative transition 46 that responds to the negative transition 44 of the signal BL<0>. A signal GREF has a constant voltage level 60, where the level is defined as the mid voltage between the high and low levels of the signal TBUS<0>. The signal SAOUT<0> has a negative transition 50 that responds to an event 48 (i.e., when the negative transition 46 of the signal TBUS<0> crosses a constant voltage level 60 of the signal GREF). The signal BL<0> has a positive transition 52 that responds to the negative transition 34 of the signal WL<0>. The signal TBUS<0> has a positive transition 54 that responds to the positive transition 52 of the signal BL<0>. The signal SAOUT<0> has a positive transition 58 that responds to an event 56 (i.e., when the positive transition 54 of the signal TBUS<0> crosses the constant voltage level 60 of the signal GREF). For this example, a memory cell located at the wordline<0> and column<0> generally holds a "0" while a memory cell located at the wordline <m>, column <0> holds a "1". Since the memory cell located at the wordline<m> and column<0> contains a "1" the signals BL<0>, TBUS<O> and SAOUT (0> are generally not affected since the current state of these signals matches the state stored in the memory cell.

Referring to FIG. 3, a circuit 10' illustrates a local reference circuit that may be used in a memory. A number of local reference blocks 18a'–18n' are shown presenting an individual reference signal to each of the sense amplifiers 16a'–16n'.

Referring to FIG. 4, a timing diagram of the circuit 10' is shown. The various signals respond in a similar fashion to the timing diagram illustrated in FIG. 2.

Referring to FIG. 5, a circuit 10" is shown illustrating a dynamic voltage reference circuit that may be used in a memory. The circuit 10" comprises a memory array 12", a column select block 14", a sense amplifier block 16", a reference block 18" and an enable control block 20". The reference block 18" is shown between the memory array 12" and the column select block 14". The memory array block 12" receives inputs WL<0:m> and DWL. The memory array block 12" generates an output DWLOUT which is presented as an input to the enable block 20". The reference block 18" generally responds to a virtual ground signal (i.e., VG<0:n>) that is received from the column select block 14".

Referring to FIG. 6, a timing diagram of the circuit of FIG. 5 is shown illustrating a signal WL<0>, a signal WL<1>, a signal COL<0>, a signal VG<0>, a signal BL<0>, a signal BLREF<0>, a signal TBUS<0>, a signal TBREF<0>, a signal DWL, a signal DWLOUT, a signal SAEN and a signal SAOUT<0>. Consider a first cycle that occurs when the wordline signal WL<0> has a positive transition 60 which selects wordline<0> and a negative transition 62 which deselects wordline<0>. The signal COL<0> has a positive transition 68 which selects column<0> and a negative transition 70 which deselects column<0>. The signal VG<0> has a negative transition 76 that responds to the positive transition 68 of the signal COL<0>, and a positive transition 78 that responds to the negative transition 70 of the signal COL<0>.

The signal BLREF<0> has a negative transition 84 that responds to the negative transition 76 of the signal VG<0>. The signal BL<0> has a negative transition 86 that responds to the positive transition 60 of the signal WL<0>. The signal TBREF<0>has a negative transition 88 that responds to the negative transition 84 of the signal BLREF<0>. A signal TBUS<0> has a negative transition 90 that responds to the negative transition 86 of the signal BL<0>. The signal TBUS<0> and TBREF<0> cross at a location 94. The signal DWL has a positive transition 114 and a negative transition 116 which are synchronized with the positive and negative transitions 60 and 62 of the signal WL<0>, respectively. The signal DWLOUT has a positive transition 118 and a negative transition 120 that respond to positive and negative transitions 114 and 116 of the signal DWL, respectively. The signal SAEN has a positive transition 122 and a negative transition 124 that respond to the positive and negative transitions 118 and 120 of the signal DWLOUT, respectively.

In a pulsed WORDLINE scheme, in order to sense data correctly it is essential that positive transition 122 of the signal SAEN occur after the crossing event 94 of the signals TBUS<0> and TBREF<0>. The signal SAOUT<0> has a negative transition 126 that responds to the positive transition 122 of the signal SAEN. It may be noted from FIG. 6 that time elapses between the beginning of the negative transition 90 of the signal TBUS<0>and the crossing event 94 with signal TBREF<0>. The signal SAEN is not activated until after the crossing event 94 has occurred. It will be shown that the time elapsed results in an increased access time and decreases the overall performance of the design.

A typical pulsed wordline scheme initiates a negative transition 62 of the signal WL<0>, a negative transition 70 of the signal COL<0> and a negative transition 116 of the signal DWL which are in response to the positive transition 122 of the signal SAEN. An example of such a pulsed wordline scheme may be found in copending application Ser. No. 08/884,561, filed on Jun. 27, 1997, (Attorney Docket No. 016820.P207) entitled "READ ONLY/ RANDOM ACCESS MEMORY ARCHITECTURE AND METHODS FOR OPERATING SAME", which is hereby incorporated by reference in its entirety or in co-pending application Ser. No. 08/884,581, filed on Jun. 27, 1997, (Attorney Docket No. 016820.P208) entitled "REFERENCE VOLTAGE GENERATOR FOR MEMORY DEVICE", which is hereby incorporated by reference in its entirety. The signal BLREF<0> has a positive transition 97 that responds to the positive transition 78 of the signal VG<0>. The signal BL<0> has a positive transition 96 that responds to the negative transition 62 of the signal WL<0>. The signal TBREF<0> has a positive transition 98 that responds to the positive transition 97 of the signal BLREF<0>. The signal TBUS<0>has a positive transition 100 that responds to positive transition 96 of the signal BL<0>. The signal DWLOUT has a negative transition 120 that responds to a negative transition 116 of the signal DWL. The signal SAEN has a negative transition 124 that responds to the negative transition 120 of the signal DWLOUT. The signal SAOUT<0> does not transition relative to the negative transition 124 of the signal SAEN because the state of SAOUT<0> is latched after the positive transition 122 of the signal SAEN occurs. The state of the signal SAOUT<0> cannot change until another positive transition 136 of the signal SAEN occurs.

A second cycle begins with a positive transition 64 of the signal WL<1> and a positive transition 72 of the signal COL<0>. The positive transition 72 of the signal COL<0> causes a negative transition 80 of the signal VG<0>. The signal BLREF<0> has a negative transition 104 that responds to the negative transition 80 of the signal VG<0>. The signal TBREF<0> has a negative transition 106 that responds to the negative transition 104 of the signal BLREF<0>. The signal DWLOUT has a positive transition 132 that responds to a positive transition 128 of the signal DWL, where the positive transition 128 and negative transition 130 of the signal DWL is synchronized with the positive transition 64 and negative transition 66 of the signal WL<1>, respectively. The signal SAEN has a positive transition 136 that responds to the positive transition 132 of the signal DWLOUT. The signal SAOUT<0> has a positive transition 140 that responds to the positive transition 136 of the signal SAEN.

The pulsed WORDLINE scheme initiates a negative transition 66 of the signal WL<1>, a negative transition 74 of the signal COL<0> and a negative transition 130 of the signal DWL each in response to the positive transition 136 of the signal SAEN. The signal VG<0> has a positive transition 108 that responds to the negative transition 74 of the signal COL<0>. The signal BLREF<0>has a positive transition 110 that responds to the positive transition 108 of the signal VG<0>. The signal TBREF<0> has a positive transition 112 that responds to the positive transition 110 of the signal BLREF<0>. The signal DWLOUT has a negative transition 134 that responds to the negative transition 130 of the signal DWL. The signal SAEN has a negative transition 138 that responds to the negative transition 134 of the signal DWLOUT. The disadvantage of the reference scheme shown in FIG. 5 and FIG. 6 is related to when the signal SAEN is activated. In FIG. 6, the positive transition 122 of the signal SAEN cannot occur until after the event 94 occurs. Additional delay measured from the beginning of the negative transition 90 of the signal TBUS<0> to the crossing event 94 is required in order to sense and latch the correct state.

Referring to FIG. 7, a diagram of a portion of the reference block 18" of FIG. 5 including two memory cells from a portion of the memory array block 12" of FIG. 5 is shown. The portion of the reference block 18" generally comprises a transistor 120, a transistor 122, a transistor 126, a transistor 128, a transistor 130 and a transistor 132. The transistors 124 and 134 generally represent memory cells that are connected between the signal WL and the virtual ground line VG<0:1> and the bitline BL<0:1>.

Referring to FIG. 8, a timing diagram of the wordline WL, the virtual ground line VG<0:1> and the bitline BL<0:1> of FIG. 7 is shown. The negative transition 84 of the signal BL<1> shows a time difference ΔT prior to the negative transition 86 of the signal BL<0>. In the first cycle the signal BL<1> acts as the reference and in the second cycle, the signal BL<0> acts as the reference.

SUMMARY OF THE INVENTION

The present invention concerns a circuit comprising a memory array having a plurality of wordlines and a plurality of bitlines, a reference circuit, a column select circuit, an enable control circuit, and one or more sense amplifiers. The reference circuit may be configured to present a reference voltage signal in response to (i) a dummy wordline and (ii) a virtual ground signal, where the dummy wordline may be synchronized with each of the plurality of wordlines. The column select circuit may be configured to present the virtual ground signal in response to a column select signal. The enable control circuit may be configured to present an enable signal in response to the dummy wordline. The sense amplifiers may be configured to generate an output in response to (i) the enable signal, (ii) the reference signal and (iii) the bitlines.

The objects, features and advantages of the present invention include providing a circuit and method for differential sensing in a single bitline memory architecture that provides faster access and/or a greater sense margin by implementing a dummy wordline to control the start of the generation of a dynamic reference voltage which is synchronized to the memory array bitline data generation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 9:
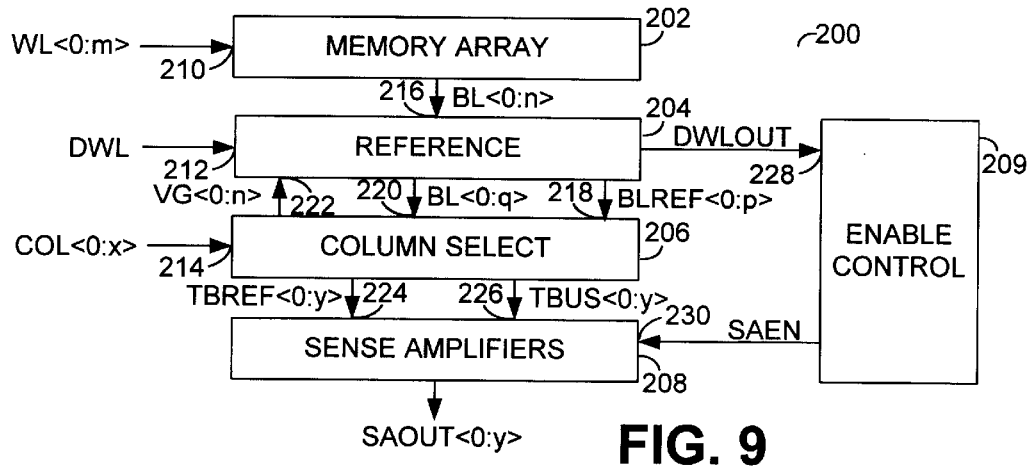
FIG. 9 is a block diagram of a preferred embodiment of the present invention.

Referring to FIG. 9, a block diagram of a circuit 200 is shown in accordance with a preferred embodiment of the present invention. The circuit 200 generally comprises a memory array block (or circuit) 202, a reference block (or circuit) 204, a column select block (or circuit) 206 and a sense amplifier block (or circuit) 208 and an enable control block 209. The memory array block 202 may have an input 210 that generally receives a wordline signal (e.g., WL<0:m>). The reference block may have an input 212 that may receive a signal (e.g., DWL) from a dummy wordline. The signal DWL generally has transitions that may be synchronized with the transitions of each of wordline signals WL<0:m> (to be described in more detail in connection with FIG. 10). The column select block 206 may have an input 214 that may receive a column select input (e.g., COL<0:x>). The memory array 202 generally presents a plurality of bitline signals (e.g., BL<0:n>) to an input 216 of reference block 204. The reference block 204 generally presents a signal BLREF<0:p> to an input 218 of the column select block 206, a signal BL<0:q> to an input 220 of the column select block 206 and a signal DWLOUT to an input 228 of the enable control block 209. The number of bits in the signal BLREF <0:p> plus the number of bits in the signal BL<0:q> is generally equal to the number of bits in the signal BL<0:n>. The column select block 206 generally presents a signal VG<0:n> to an input 222 of the reference block 204, a signal TBREF<0:y> to an input 224 of the sense amplifier block 208 and a signal TBUS<0:y> to an input 226 of the sense amplifier block 208. The enable control block 209 generally presents a signal SAEN to an input 230 of the sense amplifier block 208. The sense amplifier block 208 generally presents a signal (e.g., SAOUT<0:y>).

Figure 10:
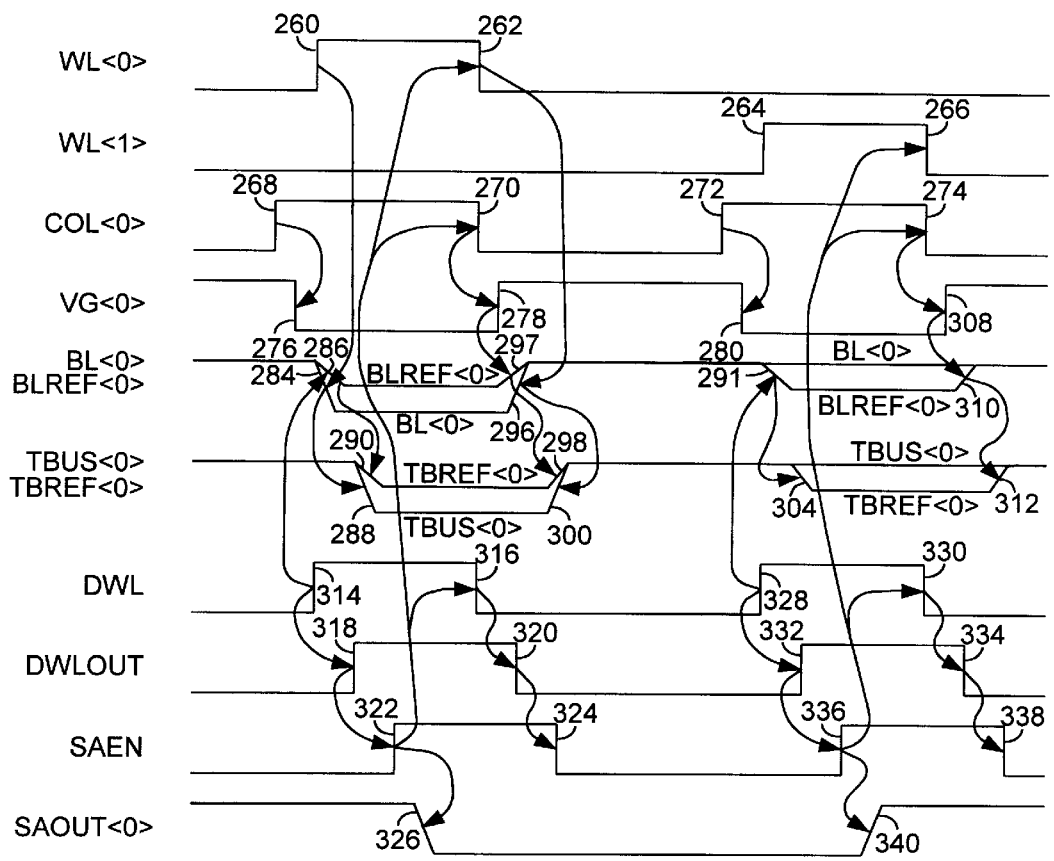
FIG. 10 is a timing diagram of the circuit of FIG. 9.

Referring to FIG. 10, a timing diagram of the circuit of FIG. 9 is shown illustrating a signal WL<0>, a signal WL<1>, a signal COL<0>, a signal VG<0>, a signal BL<0>, a signal BLREF<0>, a signal TBUS<0>, a signal TBREF<0>, a signal DWL, a signal DWLOUT, a signal SAEN and a signal SAOUT<0>. Consider a first cycle where wordline signal WL<0> has a positive transition 260 which may select wordline<0> and a negative transition 262 which may deselect wordline<0>. The signal COL<0> has a positive transition 268 which may select column<0>, a negative transition 270 which may deselect column<0>. The signal VG<0> has a negative transition 276 that may respond to the positive transition 268 of the signal COL<0>, and a positive transition 278 that may respond to the negative transition 270 of the signal COL<0>.

The signal BLREF<0> has a negative transition 286 that may respond to the positive transition 314 of the signal DWL. The signal BL<0> has a negative transition 284 that may respond to the positive transition 260 of the signal WL<0>. The signal TBREF<0>has a negative transition 290 that may respond to the negative transition 286 of the signal BLREF<0>. A signal TBUS<0> has a negative transition 288 that may respond to the negative transition 284 of the signal BL<0>. The signal DWL may have a positive transition 314 and a negative transition 316 which are generally synchronized with the positive and negative transitions 260 and 262 of the signal WL<0>, respectively. The signal DWLOUT may have a positive transition 318 and a negative transition 320 that may respond to positive and negative transitions 314 and 316 of the signal DWL, respectively. The signal SAEN has a positive transition 322 and a negative transition 324 that may respond to the positive and negative transitions 318 and 320 of the signal DWLOUT. The signal SAOUT<0> has a negative transition 326 that may respond to the positive transition 322 of the signal SAEN.

A typical pulsed wordline scheme initiates a negative transition 262 of the signal WL<0>, a negative transition 270 of the signal COL<0> and a negative transition 316 of the signal DWL, which may each respond to the positive transition 322 of the signal SAEN. The signal BLREF<0> has a positive transition 297 that may respond to the positive transition 278 of the signal VG<0>. The signal TBREF<0> has a positive transition 298 that may respond to the positive transition 297 of the signal BLREF<0>. The signal BL<0> has a positive transition 296 that may respond to the negative transition 262 of the signal WL<0>. The signal TBUS<0>has a positive transition 300 that may respond to positive transition 296 of the signal BL<0>. The signal DWLOUT has a negative transition 320 that may respond to a negative transition 316 of the signal DWL. The signal SAEN has a negative transition 324 that responds to the negative transition 320 of the signal DWLOUT. The signal SAOUT<0> does not transition relative to the negative transition 324 of the signal SAEN because the state of SAOUT is latched after the positive transition 322 of the signal SAEN occurs. The state of signal SAOUT<0> cannot change until another positive transition 336 of the signal SAEN occurs.

A second cycle may begin with a positive transition 264 of the signal WL<1> and a positive transition 272 of the signal COL<0>. The positive transition 272 of the signal COL<O> may cause a negative transition 280 of the signal VG<0>. The signal BLREF<O>has a negative transition 291 that may respond to the positive transition 328 of the signal DWL. The signal TBREF<O> has a negative transition 304 that may respond to the negative transition 291 of the signal BLREF<O>. The signal DWLOUT has a positive transition 332 that may respond to a positive transition 328 of the signal DWL, where the signal DWL is generally synchronized with the signal WL<1>. The signal SAEN has a positive transition 336 that may respond to the positive transition 332 of the signal DWLOUT. The signal SAOUT<0> has a positive transition 340 that may respond to the positive transition 336 of the signal SAEN. The pulsed WORDLINE scheme initiates a negative transition 266 of the signal WL<1>, a negative transition 274 of the signal COL<0> and a negative transition 330 of the signal DWL each in response to the positive transition 336 of the signal SAEN. The signal VG<0> has a positive transition 308 that may respond to the negative transition 274 of the signal COL<0>. The signal BLREF<0> has a positive transition 310 that may respond to the positive transition 308 of the signal VG<0>. The signal TBREF<0> has a positive transition 312 that may respond to the positive transition 310 of the signal BLREF<0>. The signal DWLOUT has a negative transition 334 that may respond to the negative transition 330 of the signal DWL. The signal SAEN has a negative transition 338 that may respond to the negative transition 334 of the signal DWLOUT. The advantage of the reference scheme shown in FIG. 9 and FIG. 10 is related to when the signal SAEN is activated. The positive transition 322 of the signal SAEN is generally activated earlier than in the circuit of FIG. 5 and FIG. 6 since the negative transitions 288 and 290 of the signals TBUS<0> and TBREF<0>, respectively, are generally synchronized so that a differential voltage is generated without waiting for a crossing event. The additional delay associated with the scheme of FIG. 5 and FIG. 6 may be avoided and the circuit 200 may sense and latch the correct state.

Figure 11:
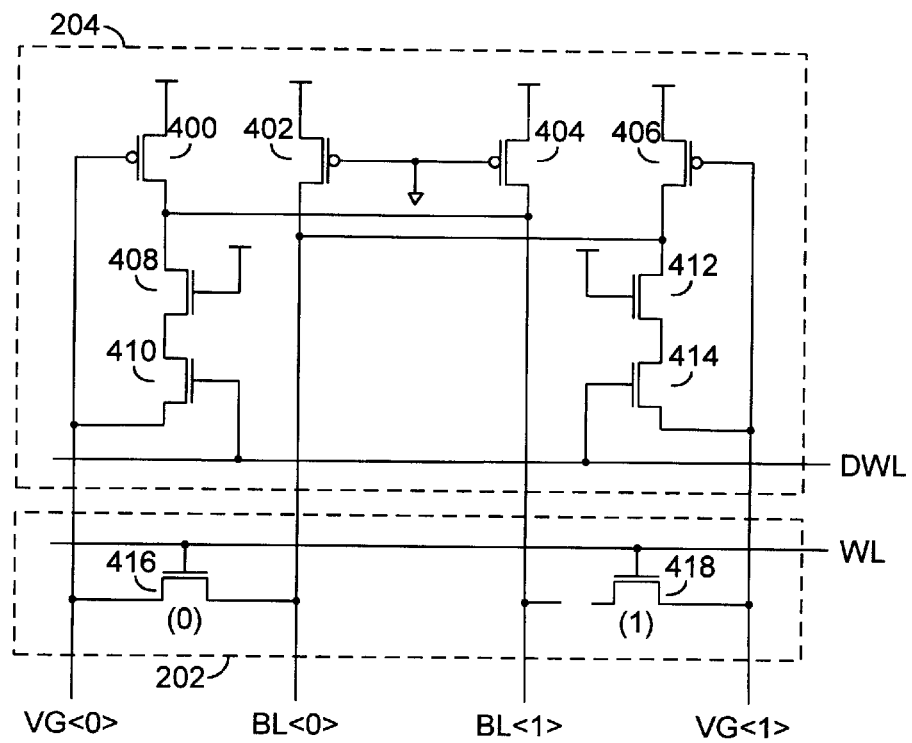
FIG. 11 is a circuit diagram of a portion of the reference block and a number of cells of the memory array of FIG. 9.

Referring to FIG. 11, a diagram of a portion of the reference block 204 of FIG. 9 and portions of the memory array of FIG. 9 is shown. The portion of the reference block 204 generally comprises a transistor 400, a transistor 402, a transistor 404, a transistor 406, a transistor 408, a transistor 410, a transistor 412, a transistor 414. The portion of the memory array block 202 may be represented by a transistor 416 and a transistor 418. The transistors 400, 402, 404, 406, 408, 410, 412 and 414 may represent reference elements, while the transistors 416 and 418 may represent memory elements. The dummy wordline DWL and the wordline WL are also shown. The wordline WL may be coupled to a gate of the transistor 416 and a gate of the transistor 418. The source/drain of the transistor 416 may be coupled to the signal VG<0>. The other source/drain of the transistor 416 may be coupled to the signal BL<0>. The source/drain of the transistor 418 may be coupled to the signal VG<1>. The other source/drain of the transistor 418 may be floating. The transistor 416 may be connected to BL<0> which may indicate a "0" is stored in the memory cell. Transistor 418 is not connected to BL<1> which may indicate a "1" is stored in the memory cell. The transistor 400 may have a gate coupled to the signal VG<0>, a source/drain that may be coupled to a power supply (e.g., VCC) and another source/drain that may be coupled to the signal BL<1>. The transistor 408 may have a gate coupled to a power supply (e.g., VCC), a source/drain that may be coupled to the signal BL<1> and another source/drain that may be coupled to a source/drain of the transistor 410. The transistor 410 may have another source/drain that may be coupled to the signal VG<0> and a gate that may be coupled to the signal DWL. The transistors 406, 412 and 414 may be connected similarly to the transistors 400, 408, and 410, respectively, with respect to the signals DWL, VG<1> and BL<1>. The transistors 402 and 404 may each have a gate coupled to ground (e.g., VSS) and a source/drain coupled to a power supply (e.g., VCC). The other source/drain of the transistors 402 and 404 may be coupled to the signals BL<0> and BL<1>, respectively.

Figure 12:
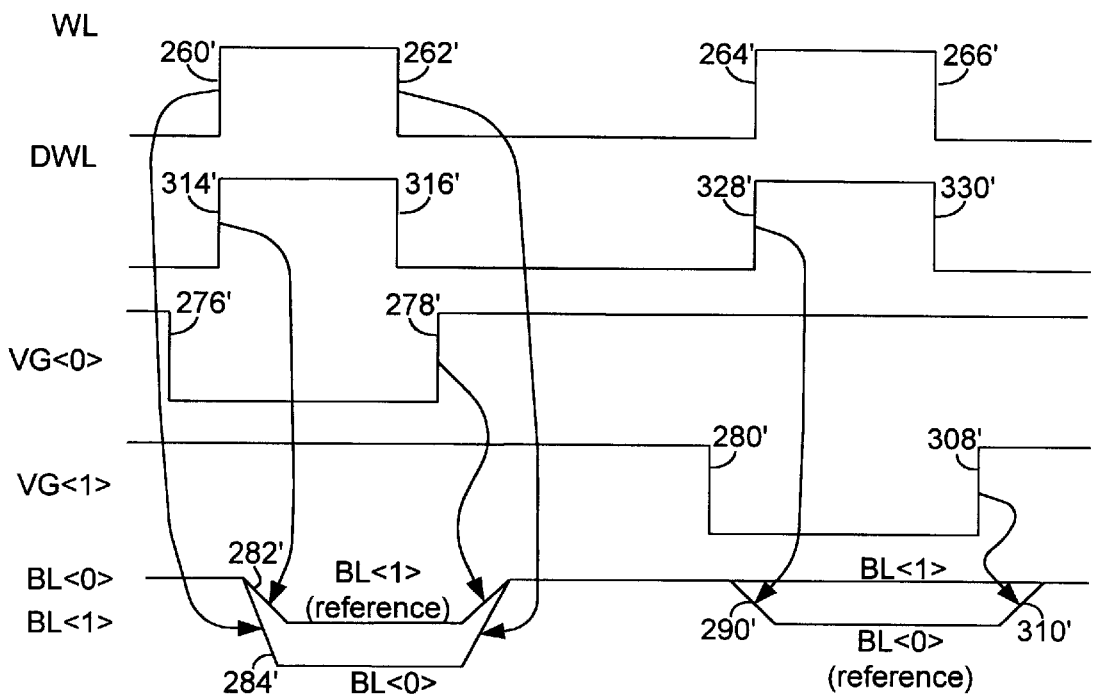
FIG. 12 is a timing diagram of the wordline, dummy wordline, virtual ground line and bitline of FIG. 11.

Referring to FIG. 12, a timing diagram illustrating the wordline WL, the dummy wordline DWL, the virtual ground VG<0>, the virtual ground VG<1>, the bitline BL<0> and the bitline BL<1> is shown. The signal BL<1> reference is shown having a negative transition 282' that responds to the positive transition 314' of the dummy wordline DWL. The signal BL<0> is shown having a negative transition 284' that may respond to the positive transition 260' of the signal WL. Since the signal WL and the signal DWL generally transition at the same time, the signal BL<1> reference and the signal BL<0> generally begin to transition at the same time, which generally synchronizes the generation of the voltage swing between the two signals, and may result in faster access time. Since the bitline (e.g., BL<0>) is not required to cross over the reference (e.g., BL<1>), the signals generally diverge, allowing differential sensing to occur sooner. The signal BL<1> does not generally transition after the positive transition 264' of the signal WL or the negative transition 266' of the signal WL. Additionally, the signal BL<0> generally has a negative transition 290' and a positive transition 310'. In this example, the BL<0> acts as the reference voltage for the signal BL<1>.

Figure 1:
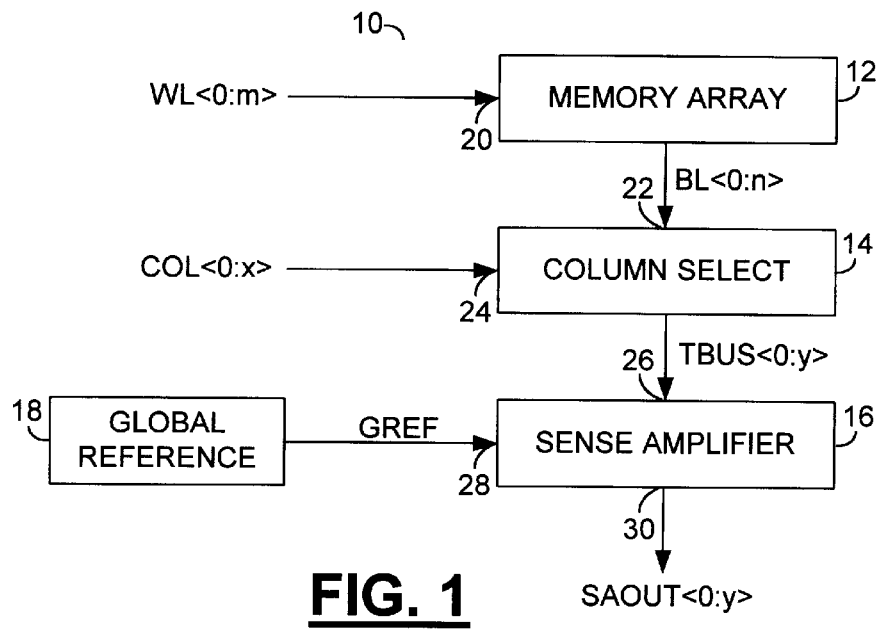
FIG. 1 is a block diagram of a conventional global reference scheme.
Figure 2:
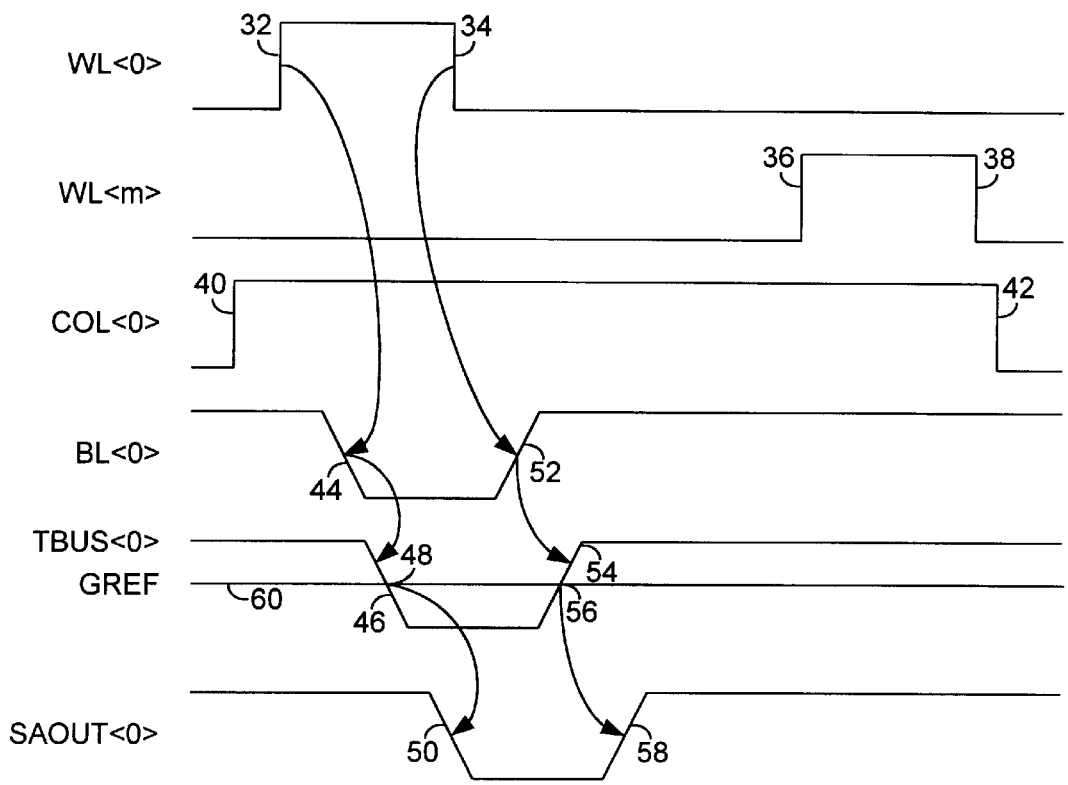
FIG. 2 is a timing diagram of the circuit of FIG. 1.
Figure 3:
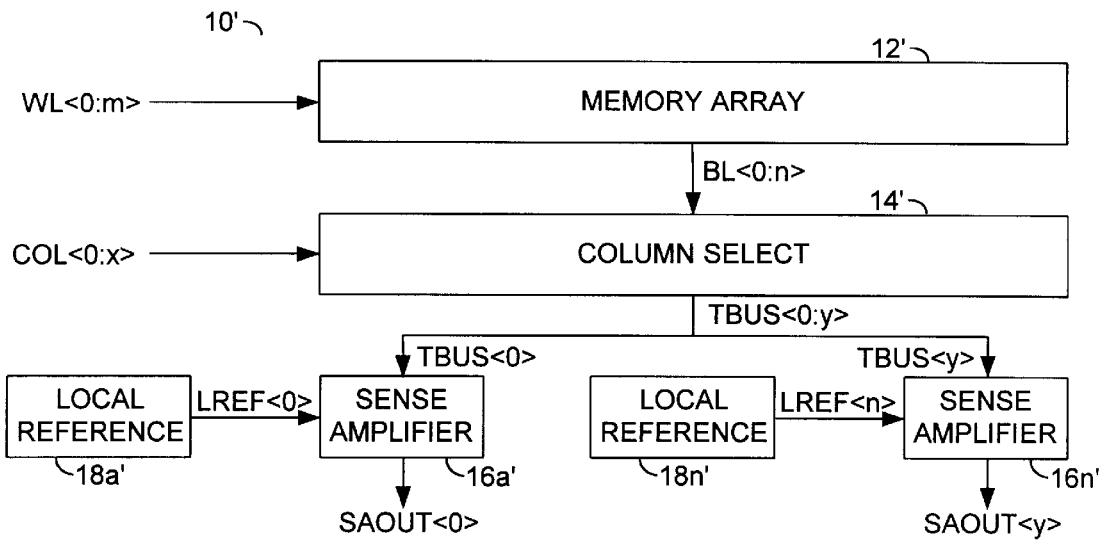
FIG. 3 is a block diagram of a local reference scheme.
Figure 4:
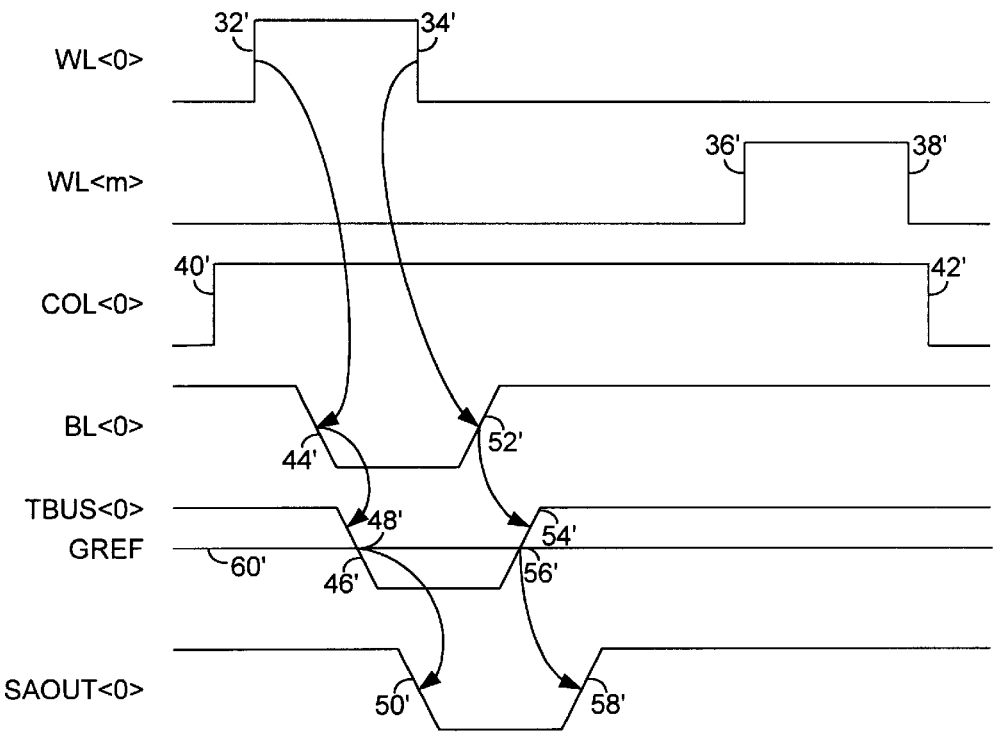
FIG. 4 is a timing diagram of the circuit of FIG. 3.
Figure 5:
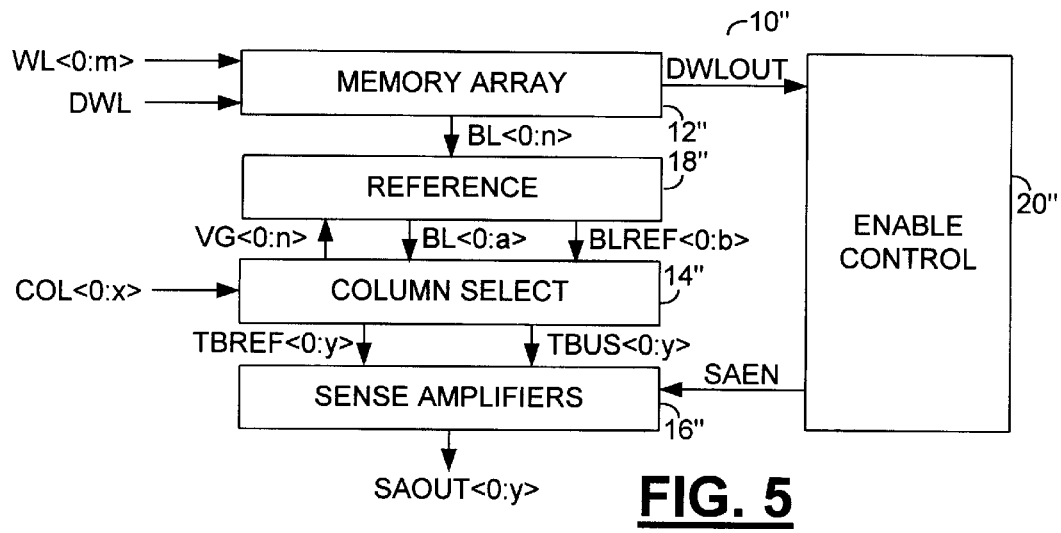
FIG. 5 is a block diagram of a dynamic reference control circuit.
Figure 6:
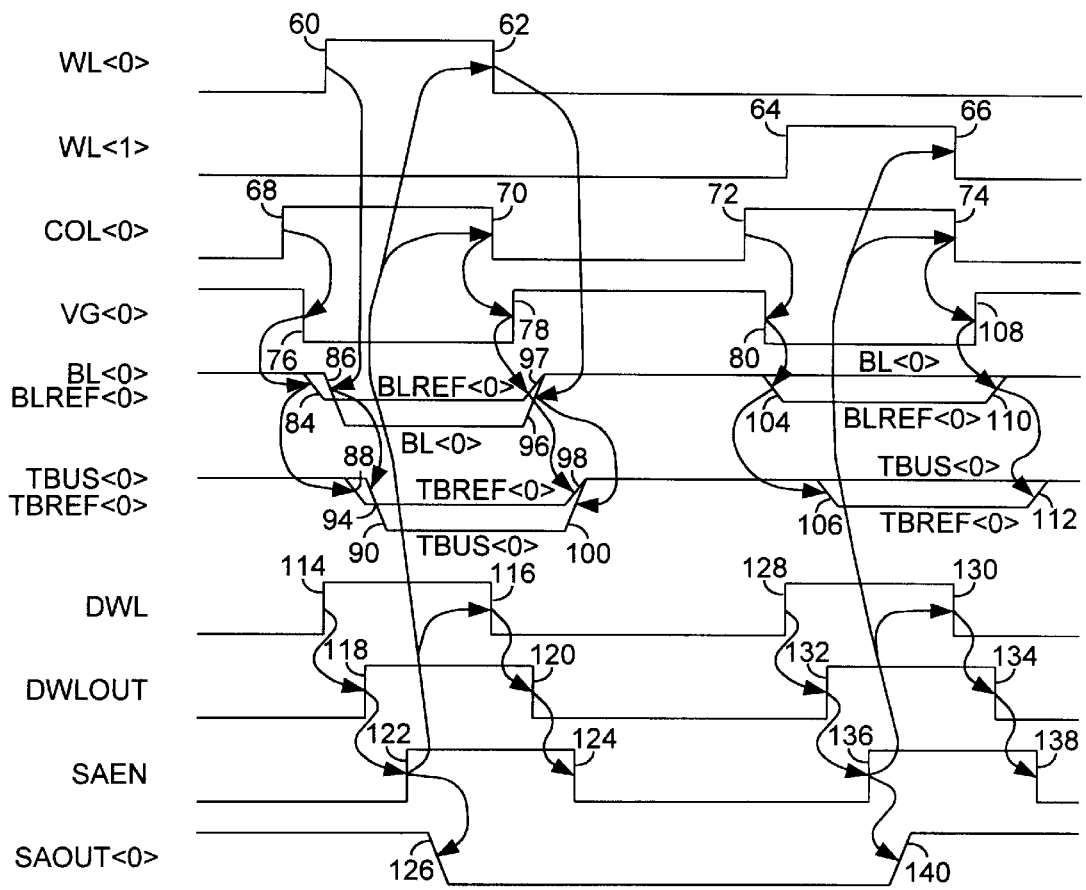
FIG. 6 is a timing diagram of the circuit of FIG. 5.
Figure 7:
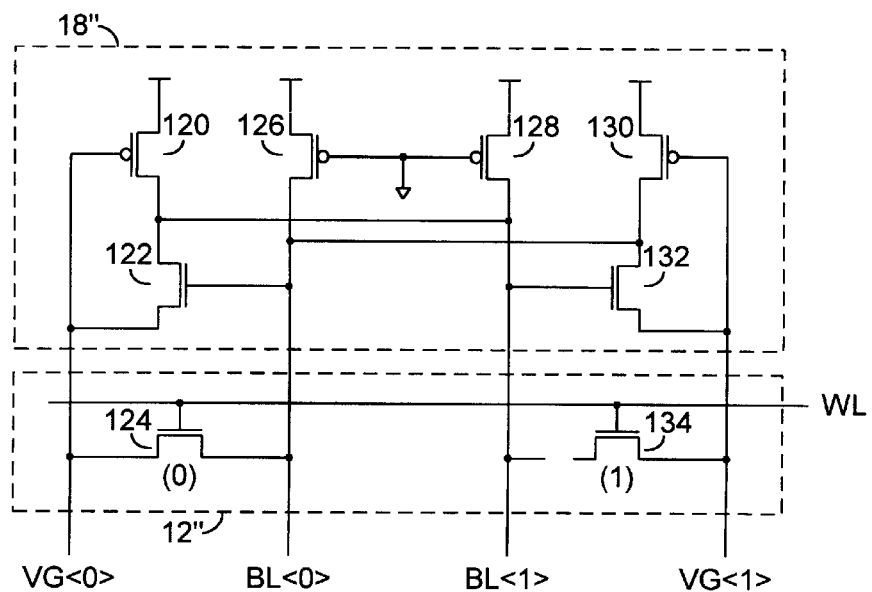
FIG. 7 is a circuit diagram of a portion of the reference block and a number of cells of the memory array of FIG. 5.
Figure 8:
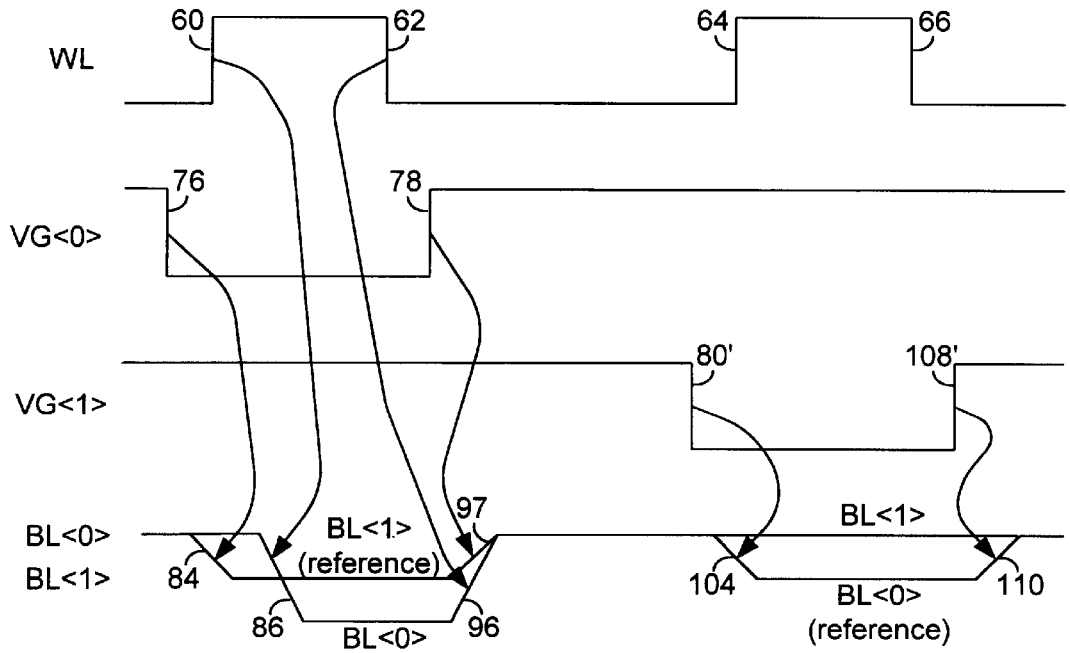
FIG. 8 is a timing diagram of the wordline, virtual ground line and bitline of FIG. 7.
Figure 13:
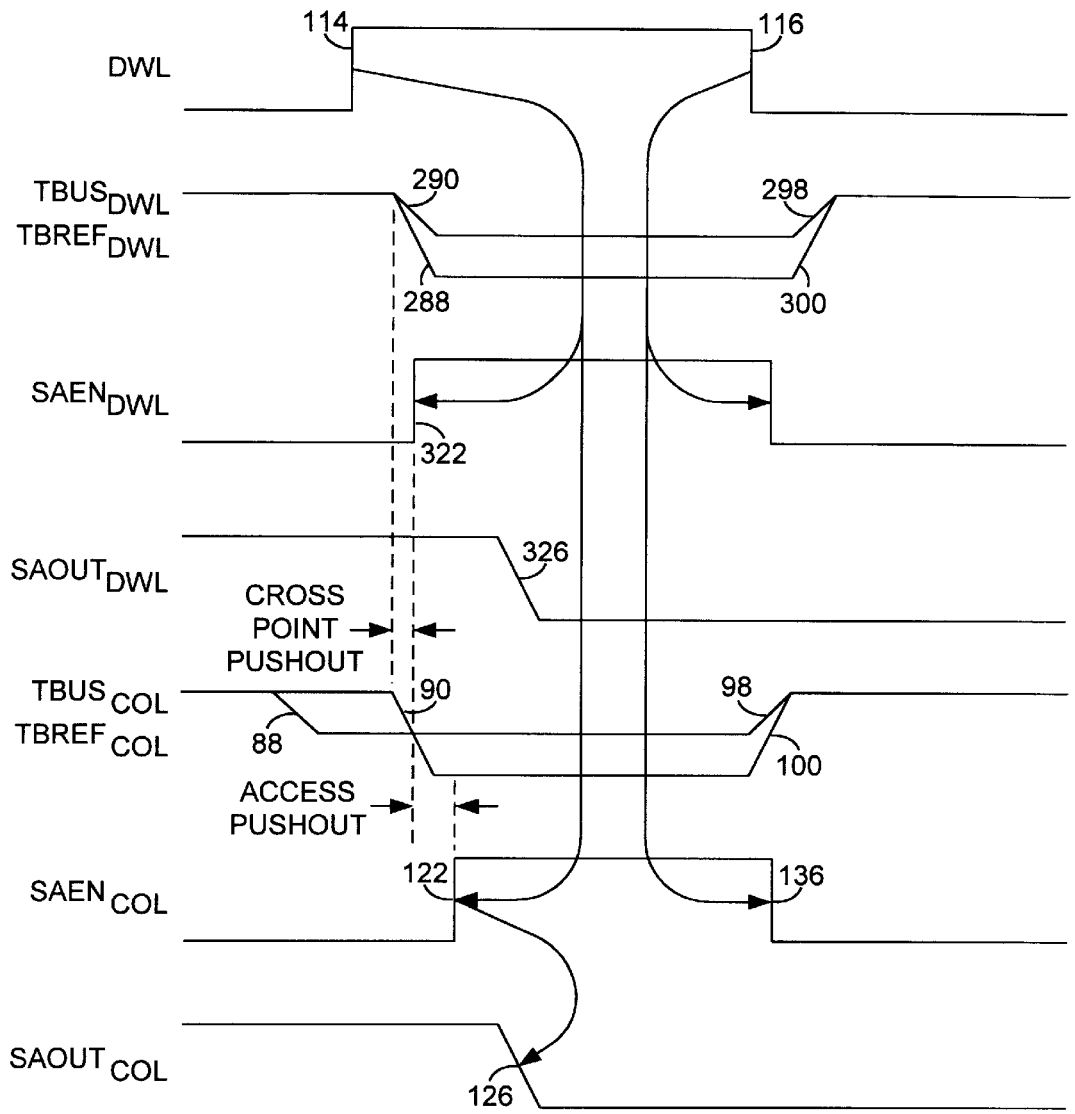
FIG. 13 is a timing diagram of the operation of the circuit of FIG. 9 as compared to the circuit of FIG. 5.

Referring to FIG. 13, a timing diagram illustrating the circuit of FIG. 9 as compared with the circuit of FIG. 5 is shown. The waveforms of the signal DWL, TBUS, TBREF, SAEN and SAOUT are shown. The waveforms for the signal TBUS are generally shown as a signal $TBUS_{DWL}$ (for the circuit of FIG. 9) and $TBUS_{COL}$ (for the circuit of FIG. 5). The waveforms for the signal $TBUS_{REF}$ are generally shown as a signal $TBUSREF_{DWL}$ (for the circuit of FIG. 9) and $TBUSREF_{COL}$ (for the circuit of FIG. 5). The waveforms for the signal SAEN are generally shown as a signal $SAEN_{DWL}$ (for the circuit of FIG. 9) and $SAEN_{COL}$ (for the circuit of FIG. 5). The waveforms for the signal SAOUT are generally shown as a signal $SAOUT_{DWL}$ (for the circuit of FIG. 9) and $SAOUT_{COL}$ (for the circuit of FIG. 5).

A cross-point push-out is generally shown, which may generally indicate the time it takes for the signal $TBREF_{COL}$ to reach a point where sensing can occur. An access push-out generally occurs in the waveforms relating to the circuit of FIG. 5 (which is an additional delay necessary to provide proper sensing of the signal in the cell) which results from the signal $TBREF_{COL}$ having the transition 88 before the signal $TBUS_{COL}$ has a negative transition 90. The access push-out can be seen as the time difference between the positive transition 322 of the signal $SAEN_{DWL}$ and the positive transition 122 of the signal $SAEN_{COL}$. Since the circuit of FIG. 9 does not have the access push-out, additional margin and/or reduced access time may be achieved.

While the invention has been particularly shown and described with reference to the preferred embodiments thereof, it will be understood by those skilled in the art that various changes in form and details may be made without departing from the spirit and scope of the invention.

We claim:

1. A circuit comprising:
   a memory array having a plurality of first wordlines and a plurality of bitlines;
   a reference circuit configured to present a reference voltage signal in response to (i) a second wordline, and (ii) a virtual ground signal, wherein said second wordline is synchronized with each of said plurality of first wordlines;
   a column select circuit configured to present said virtual ground signal in response to a column select signal;
   a control circuit configured to present an enable signal in response to said second wordline; and
   a sense amplifier configured to generate an output in response to (i) said enable signal, (ii) said reference signal and (iii) one or more signals from said bitlines.

2. The circuit according to claim 1, wherein said memory array comprises a dual bitline architecture configured as a single bitline architecture memory array.

3. The circuit according to claim 1, wherein said memory array comprises a single bitline architecture memory array.

4. The circuit according to claim 1, wherein said one or more signals from said bitlines comprise one or more TBUS signals.

5. The circuit according to claim 1, wherein said memory array comprises a first portion having a single bitline architecture and a second portion having a dual bitline architecture.

6. The circuit according to claim 5, wherein said single bitline architecture comprises a ROM memory and said dual bitline architecture comprises a RAM memory.

7. The circuit according to claim 1, wherein said second wordline comprises a dummy wordline.

8. A circuit comprising:

a memory array having a plurality of first wordlines and a plurality of bitlines;

means for presenting a reference voltage signal in response to (i) a second wordline, and (ii) a virtual ground signal, wherein said second wordline is synchronized with each of said plurality of first wordlines;

means for presenting said virtual ground signal in response to a column select signal;

means for presenting an enable signal in response to said second wordline; and means for presenting an output in response to (i) said enable signal, (ii) said reference signal and (iii) one or more signals from said bitlines.

9. The circuit according to claim 8, wherein said memory array comprises a dual bitline architecture configured as a single bitline architecture memory array.

10. The circuit according to claim 8, wherein said memory array comprises a single bitline architecture memory array.

11. A method for reading data comprising the steps of:

(A) providing a plurality of first wordlines and a plurality of bitlines;

(B) presenting a reference voltage signal in response to (i) a second wordline, and (ii) a virtual ground signal, wherein said second wordline is synchronized with each of said plurality of first wordlines;

(C) presenting said virtual ground signal in response to a column select signal;

(D) presenting an enable signal in response to said second wordline; and (E) generating an output in response to (i) said enable signal, (ii) said reference signal and (iii) one or more signals from said bitlines.

12. The method according to claim 11, wherein said plurality of first wordlines are configured as a single bitline architecture memory array.

13. The method according to claim 11, wherein said plurality of first wordlines are a dual bitline architecture configured as a single bitline architecture memory array.

14. The method according to claim 11, wherein said one or more signals from said bitlines comprise one or more TBUS signals.

15. The method according to claim 11, wherein said plurality of first wordlines comprises a first portion having a single bitline architecture and a second portion having a dual bitline architecture.

16. The method according to claim 15, wherein said single bitline architecture comprises a ROM memory and said dual bitline architecture comprises a RAM memory.

17. The method according to claim 11, wherein said second wordline comprises a dummy wordline.

* * * * *